United States Patent
Hirose et al.

(10) Patent No.: US 12,035,629 B2
(45) Date of Patent: *Jul. 9, 2024

(54) THERMOELECTRIC CONVERSION MATERIAL, THERMOELECTRIC CONVERSION ELEMENT, THERMOELECTRIC CONVERSION MODULE, AND OPTICAL SENSOR

(71) Applicants: Sumitomo Electric Industries, Ltd., Osaka (JP); Toyota School Foundation, Nagoya (JP)

(72) Inventors: Kotaro Hirose, Osaka (JP); Masahiro Adachi, Osaka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 250 days.

This patent is subject to a terminal disclaimer.

(21) Appl. No.: 17/631,495

(22) PCT Filed: Aug. 6, 2020

(86) PCT No.: PCT/JP2020/030154
§ 371 (c)(1),
(2) Date: Jan. 31, 2022

(87) PCT Pub. No.: WO2021/039342
PCT Pub. Date: Mar. 4, 2021

(65) Prior Publication Data
US 2022/0278263 A1    Sep. 1, 2022

(30) Foreign Application Priority Data
Aug. 30, 2019 (JP) ................. 2019-158253

(51) Int. Cl.
*H01L 35/32* (2006.01)
*C01B 19/00* (2006.01)
(Continued)

(52) U.S. Cl.
CPC .......... *H10N 10/852* (2023.02); *C01B 19/00* (2013.01); *C01G 5/00* (2013.01); *G01J 5/12* (2013.01); *H10N 10/17* (2023.02)

(58) Field of Classification Search
None
See application file for complete search history.

(56) References Cited

U.S. PATENT DOCUMENTS

2014/0352750 A1* 12/2014 Shin ............... H10N 10/851
  136/200
2015/0311418 A1* 10/2015 Ballinger ........... H10N 10/852
  419/48

(Continued)

FOREIGN PATENT DOCUMENTS

JP    63-102382 A    5/1988
JP    2015-79796 A   4/2015
(Continued)

OTHER PUBLICATIONS

Singh et al., "Improvement of thermoelectric properties of Ag2S by Se substitution," Proceedings of the 80th JSAP Autumn Meeting, Sep. 18, 2019, 2 pages. (Year: 2019).*

(Continued)

*Primary Examiner* — David P Porta
*Assistant Examiner* — Carolyn Fin
(74) *Attorney, Agent, or Firm* — XSENSUS LLP

(57) ABSTRACT

A thermoelectric conversion material is represented by a composition formula $Ag_2S_{(1-x)}Se_x$, where x has a value of greater than 0.01 and smaller than 0.6.

9 Claims, 10 Drawing Sheets

(51) Int. Cl.
  *C01G 5/00* (2006.01)
  *G01J 5/12* (2006.01)
  *H01L 35/16* (2006.01)
  *H10N 10/17* (2023.01)
  *H10N 10/852* (2023.01)

(56) References Cited

U.S. PATENT DOCUMENTS

| | | | |
|---|---|---|---|
| 2016/0172568 A1* | 6/2016 | Ko | H10N 10/852 |
| | | | 252/62.3 T |
| 2016/0218267 A1 | 7/2016 | Ko et al. | |
| 2016/0251992 A1 | 9/2016 | Kim et al. | |
| 2016/0300994 A1 | 10/2016 | Adachi et al. | |
| 2017/0069812 A1 | 3/2017 | Toshima et al. | |
| 2019/0214538 A1 | 7/2019 | Adachi et al. | |
| 2019/0229252 A1* | 7/2019 | Leblanc | B22F 12/41 |
| 2022/0102607 A1* | 3/2022 | Lim | H10N 10/857 |
| 2022/0310898 A1 | 9/2022 | Adachi et al. | |

FOREIGN PATENT DOCUMENTS

| | | |
|---|---|---|
| JP | 2015-135939 A | 7/2015 |
| JP | 2015-170766 A | 9/2015 |
| JP | 2016-163039 A | 9/2016 |
| WO | 2014/126211 A1 | 8/2014 |
| WO | 2018/043478 A1 | 3/2018 |

OTHER PUBLICATIONS

Mi et al., "Thermoelectric Transport of Se-rich Ag2Se in Normal Phases and Phase Transitions", Applied Physics Letters, 2014, vol. 104, 5 pages.

Marhoun Ferhat et al., "Thermoelectric and transport properties of β-Ag2Se compounds", Journal of Applied Physics, vol. 88, No. 2, Jul. 15, 2000, pp. 813-816, total 5 pages.

Office Action issued on Jan. 31, 2024, in corresponding co-pending U.S. Appl. No. 17/633,583, 29 pages.

* cited by examiner

THERMOELECTRIC CONVERSION MATERIAL, THERMOELECTRIC CONVERSION ELEMENT, THERMOELECTRIC CONVERSION MODULE, AND OPTICAL SENSOR

CROSS-REFERENCE TO RELATED APPLICATIONS

The present application is based on PCT filing PCT/JP2020/030154, filed Aug. 6, 2020, and claims priority to Japanese Application No. 2019-158253, filed Aug. 30, 2019, the entire contents of each are incorporated herein by reference.

TECHNICAL FIELD

The present disclosure relates to a thermoelectric conversion material, a thermoelectric conversion element, a thermoelectric conversion module, and an optical sensor.

BACKGROUND ART

Nanowires or nanotubes made of a semiconductor $Bi_2Te_3$, $Bi_2Se_3$, or $Bi_2Se_xTe_{3-x}$ ($0<x<3$) and integrated into the form of a non-woven fabric are used for a thermoelectric conversion material portion constituting a thermoelectric conversion element (e.g., Patent Literature 1). A film obtained by applying a chalcogenide nanoparticle solution to a flexible substrate and drying it is used for a thermoelectric conversion material portion constituting a thermoelectric conversion element (e.g., Patent Literature 2). A chalcogenide-based thin film deposited on a flexible substrate is used for a thermoelectric conversion material portion constituting a thermoelectric conversion element (e.g., Patent Literature 3). Further, $\alpha$-$Ag_2S$ (silver sulfide) is known as a material having ductility (e.g., Non Patent Literature 1). A material with part of S in $Ag_2S$ replaced by Se is also known (e.g., Non Patent Literature 2).

CITATION LIST

Patent Literature

Patent Literature 1: International Patent Publication No. WO 2014/126211
Patent Literature 2: Japanese Patent Application Laid-Open No. 2016-163039
Patent Literature 3: Japanese Patent Application Laid-Open No. S63-102382

Non Patent Literature

Non Patent Literature 1: Guodong Li et al., "Ductile deformation mechanism in semiconductor $\alpha$-$Ag_2S$", npj Computational Materials (2018) 44
Non Patent Literature 2: Jiasheng Liang et al., "Flexible thermoelectrics: from silver chalcogenides to full-inorganic devices", Energy & Environmental Science 2019. 12. 2983-2990

SUMMARY OF INVENTION

Solution to Problem

A thermoelectric conversion material according to the present disclosure is represented by a composition formula $Ag_2S_{(1-x)}Se_x$, where x has a value of greater than 0.01 and smaller than 0.6.

DESCRIPTION OF EMBODIMENTS

Figure 1:
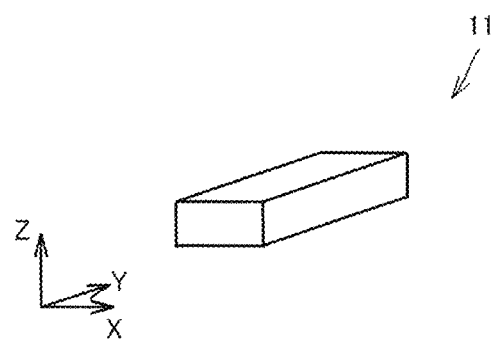
FIG. 1 is a schematic diagram showing the appearance of a thermoelectric conversion material in Embodiment 1.

Problems to be Solved by the Present Disclosure

In thermoelectric conversion, heat is directly converted into electric power, so no extra waste is discharged during the conversion. A power generation device utilizing the thermoelectric conversion requires no motor or other drive unit, offering advantages such as easy maintenance of the device.

Efficiency $\eta$ in converting a temperature difference (heat energy) into electric energy using a material (thermoelectric conversion material) for thermoelectric conversion is given by the following expression (1).

$$\eta = \Delta T/T_h \cdot (M-1)/(M+T_c/T_h) \quad (1)$$

In the expression, $\eta$ represents a conversion efficiency, $\Delta T$ represents a difference between $T_h$ and $T_c$, $T_h$ represents a temperature on the high temperature side, $T_c$ represents a temperature on the low temperature side, M equals to $(1+ZT)^{1/2}$, $ZT=\alpha^2 ST/\kappa$, ZT represents a dimensionless figure of merit, $\alpha$ represents a Seebeck coefficient, S represents an electrical conductivity, T represents a temperature, and $\kappa$ represents a thermal conductivity. The conversion efficiency is a monotonously increasing function of ZT. It is important to increase ZT in developing a thermoelectric conversion material.

Conceivable heat sources for thermoelectric conversion include the human body and a pipe through which a fluid higher in temperature than room temperature flows. For example, it will be preferable from the practical standpoint if a thermoelectric conversion material portion made up of a thermoelectric conversion material can be attached along a curved surface such as the surface of the human body or the surface of the pipe. A thermoelectric conversion material having flexibility will facilitate attaching the thermoelectric conversion material portion along the curved surface. High thermoelectric conversion efficiency is also required for a thermoelectric conversion material.

In view of the foregoing, one of the objects is to provide a thermoelectric conversion material, a thermoelectric conversion element, a thermoelectric conversion module, and an optical sensor which have flexibility and can also realize high thermoelectric conversion efficiency.

Advantageous Effects of the Present Disclosure

The thermoelectric conversion material described above has flexibility and is also able to realize high thermoelectric conversion efficiency.

DESCRIPTION OF EMBODIMENTS OF THE PRESENT DISCLOSURE

Firstly, embodiments of the present disclosure will be listed and described. A thermoelectric conversion material according to the present disclosure is represented by a composition formula $Ag_2S_{(1-x)}Se_x$, where x has a value of greater than 0.01 and smaller than 0.6.

The present inventors have conducted intensive studies to realize both flexibility and high thermoelectric conversion efficiency, and found that a material represented by a composition formula $Ag_2S_{(1-x)}Se_x$ functions as a thermoelectric conversion material. As a result of further studies on the content ratios of sulfur (S) and selenium (Se), they have found that with the composition formula $Ag_2S_{(1-x)}Se_x$, when the value of x is 0.01 or smaller, the function as the thermoelectric conversion material is insufficient, whereas when the value of x is 0.6 or greater, flexibility cannot be secured. That is, the thermoelectric conversion material represented by the composition formula $Ag_2S_{(1-x)}Se_x$ where x has a value of greater than 0.01 and smaller than 0.6 can have flexibility and also realize high thermoelectric conversion efficiency.

Although the reason the material exhibits such thermoelectric performance is not clear, it can be considered, for example, as follows. The reason for the thermoelectric performance is considered to be an isoelectronic trap caused by a difference in electronegativity between S and Se. Specifically, because of the high electronegativity of S, electrons from Se atoms are attracted to S atoms. The Se atom side thus becomes positively charged, causing free electrons to be trapped near the Se atoms. As a result, a band gap like that of insulating materials is obtained and the Seebeck coefficient becomes high. It is also considered that the flexibility of the thermoelectric conversion material is secured because the density of states of ductile $Ag_2S$ is dominant. Thus, the thermoelectric conversion material of the present disclosure is considered to have flexibility and be also able to realize high thermoelectric conversion efficiency.

In the thermoelectric conversion material described above, the value of x may be greater than 0.2. This makes it possible to reliably obtain a thermoelectric conversion material that has flexibility and is also able to realize high thermoelectric conversion efficiency.

In the thermoelectric conversion material described above, the value of x may be smaller than 0.5. With this, a thermoelectric conversion material that has flexibility and is also able to realize high thermoelectric conversion efficiency can be obtained reliably.

A thermoelectric conversion element of the present disclosure includes: a thermoelectric conversion material portion; a first electrode disposed in contact with the thermoelectric conversion material portion; and a second electrode disposed in contact with the thermoelectric conversion material portion and apart from the first electrode. The thermoelectric conversion material portion is constituted by the above-described thermoelectric conversion material.

In the thermoelectric conversion element of the present disclosure, the material constituting the thermoelectric conversion material portion is the above-described thermoelectric conversion material. Therefore, the thermoelectric conversion element of the present disclosure has flexibility and is also able to realize high thermoelectric conversion efficiency.

In the thermoelectric conversion element described above, the thermoelectric conversion element may be used in a temperature range in which a cubic crystal structure and at least one of monoclinic and orthorhombic crystal structures are coexistent in the thermoelectric conversion material. When the thermoelectric conversion element is used in such a temperature range, the dimensionless figure of merit ZT of the thermoelectric conversion material becomes larger. Thus, a higher thermoelectric conversion efficiency can be achieved.

A thermoelectric conversion module of the present disclosure includes the above-described thermoelectric conversion element. According to the thermoelectric conversion module of the present disclosure, with the inclusion of the thermoelectric conversion element of the present disclosure having flexibility and being able to realize high thermoelectric conversion efficiency, a thermoelectric conversion module that has flexibility and is also able to realize high thermoelectric conversion efficiency can be obtained.

An optical sensor of the present disclosure includes: an absorber that absorbs optical energy; and a thermoelectric conversion material portion connected to the absorber. The thermoelectric conversion material portion is constituted by the above-described thermoelectric conversion material.

In the optical sensor of the present disclosure, the material constituting the thermoelectric conversion material portion is the above-described thermoelectric conversion material. Therefore, an optical sensor that has flexibility as well as high sensitivity can be provided.

Another thermoelectric conversion element of the present disclosure includes: a first material portion of a plate shape that is constituted by the thermoelectric conversion material according to any one of claims 1 to 3 and has n type conductivity; an insulating second material portion of a plate shape that is disposed on the first material portion and has flexibility; a third material portion that is disposed on the first material portion in a position different from the second material portion and has electrical conductivity; and a fourth material portion that is disposed on the second material portion and in contact with the third material portion, is composed of at least one of a metallic material and a thermoelectric conversion material having p type conductivity, and has flexibility.

Such a thermoelectric conversion element has flexibility in the thickness direction, which is the direction in which the materials are stacked. Therefore, the thermoelectric conversion element is flexible in the thickness direction, which can reduce the risk of cracking or chipping. Further, the assembly process required for ordinary thermoelectric modules is unnecessary, making the producing process relatively simple. Furthermore, the density of the thermocouples can be easily increased as compared to the ordinary thermoelectric modules, facilitating the downsizing of the module.

In the thermoelectric conversion element of the present disclosure, the material constituting the second material portion may be $Ag_2S$. $Ag_2S$ has flexibility. $Ag_2S$ also has ductility, facilitating the process of forming it into a plate shape. Therefore, such a material is suitably used for the above-described thermoelectric conversion element.

DETAILS OF EMBODIMENTS OF THE PRESENT DISCLOSURE

Embodiments of the thermoelectric conversion material of the present disclosure will be described below with reference to the drawings. In the drawings referenced below, the same or corresponding parts are denoted by the same reference numerals and the descriptions thereof are not repeated.

Embodiment 1

A description will be made of a configuration of a thermoelectric conversion material according to Embodiment 1 of the present disclosure. The thermoelectric conversion material according to Embodiment 1 of the present disclosure is represented by a composition formula $Ag_2S_{(1-x)}Se_x$, where x has a value of greater than 0.01 and smaller than 0.6.

The thermoelectric conversion material according to Embodiment 1 can be produced, for example, through the following producing method. Firstly, silver (Ag) powder, sulfur (S) powder, and selenium (Se) powder are prepared. Here, when the thermoelectric conversion material is represented by the composition formula $Ag_2S_{(1-x)}Se_x$, the mixing ratios of S and Se are adjusted such that the value of x is greater than 0.01 and smaller than 0.6. The powders are mixed, pressed, and solidified into a pellet form, thereby obtaining a green compact. Next, a portion of the obtained green compact in the pellet form is heated for crystallization.

The heating of a portion of the green compact is performed within a chamber having a heater such as a resistance heating wire, for example. The chamber has a reduced pressure. Specifically, the degree of vacuum in the chamber is set to be about $1 \times 10^{-4}$ Pa, for example. The green compact is heated with the heater for about one second. When the crystallization start temperature is reached, a portion of the green compact is crystallized. The heating is stopped after the crystallization of the portion of the green compact. In this case, the crystallization is promoted by self-heating without the need of reheating. That is, the remaining portion of the green compact is crystallized by the self-heating of the green compact with the progress of crystallization. In this manner, the thermoelectric conversion material in Embodiment 1 is obtained. Examples of the specific composition of the thermoelectric conversion material include $Ag_2S_{0.7}Se_{0.3}$, with the value of x being 0.3.

FIG. 1 is a schematic diagram showing the appearance of a thermoelectric conversion material in Embodiment 1. Referring to FIG. 1, the thermoelectric conversion material 11 is, for example, a strip-shaped bulk body having a thickness. The thermoelectric conversion material 11 can be subjected to rolling using metal rollers. Specifically, with the metal rollers, the thermoelectric conversion material 11 can be rolled to a thickness in the Z direction in FIG. 1 in a range of, for example, 5 mm to 1 μm. Such a thermoelectric conversion material 11 has flexibility and does not shatter during rolling. By virtue of the flexibility, the thermoelectric conversion material 11 can be bent along a curved surface, for example in the Z direction.

Figure 2:
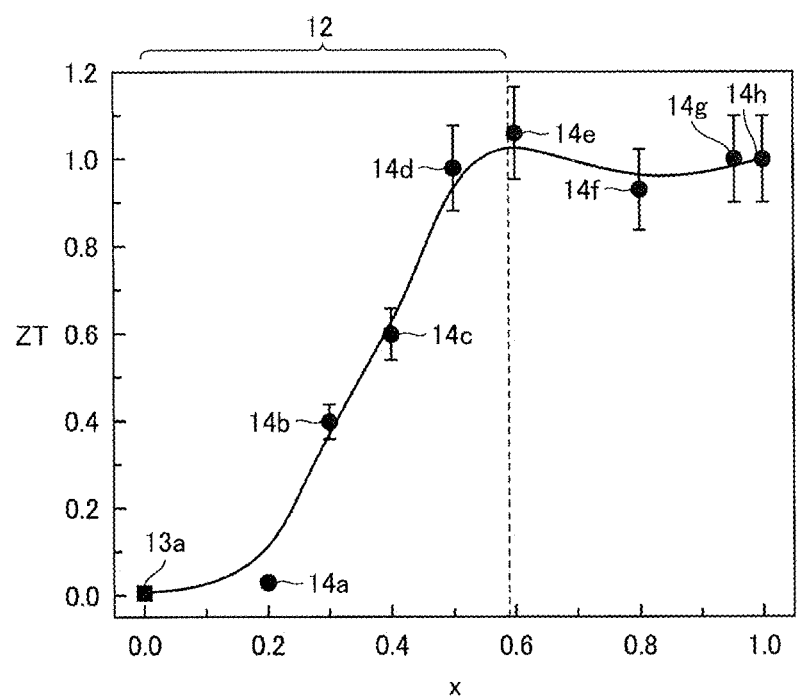
FIG. 2 is a graph showing a relationship between ZT and the value of x of the thermoelectric conversion material.

FIG. 2 is a graph showing a relationship between ZT and the value of x of the thermoelectric conversion material. In FIG. 2, the horizontal axis represents the value of x, i.e. the Se content ratio, and the vertical axis represents the value of ZT. FIG. 2 shows the values of x from 0 to 1.0. A data item 13a is shown as a reference value. Data items 14a, 14b, 14c, 14d, 14e, 14f, 14g, and 14h each show a maximum value of ZT derived. The data item 13a indicates a value of ZT when the temperature is 450 K. The data item 14a indicates a value of ZT when the temperature is 395 K. The data item 14b indicates a value of ZT when the temperature is 365 K. The data item 14c indicates a value of ZT when the temperature is 360 K. The data item 14d indicates a value of ZT when the temperature is 350 K. The data item 14e indicates a value of ZT when the temperature is 340 K. The data item 14f indicates a value of ZT when the temperature is 360 K. The data item 14g indicates a value of ZT when the temperature is 395 K. The data item 14h indicates a value of ZT when the temperature is 404 K.

Referring to FIG. 2, the value of ZT increases as the value of x increases from 0. When the value of x becomes 0.6, the value of ZT becomes greater than 1.0. When the value of x exceeds 0.6, the material ceases to have flexibility. The thermoelectric conversion material in Embodiment 1 has flexibility in a range indicated by a region 12 where the value of x is greater than 0.01 and smaller than 0.6. For the flexibility, the thermoelectric conversion material is determined to have flexibility when the block of the thermoelectric conversion material shown in FIG. 1 is in a state where it can be rolled.

Figure 3:
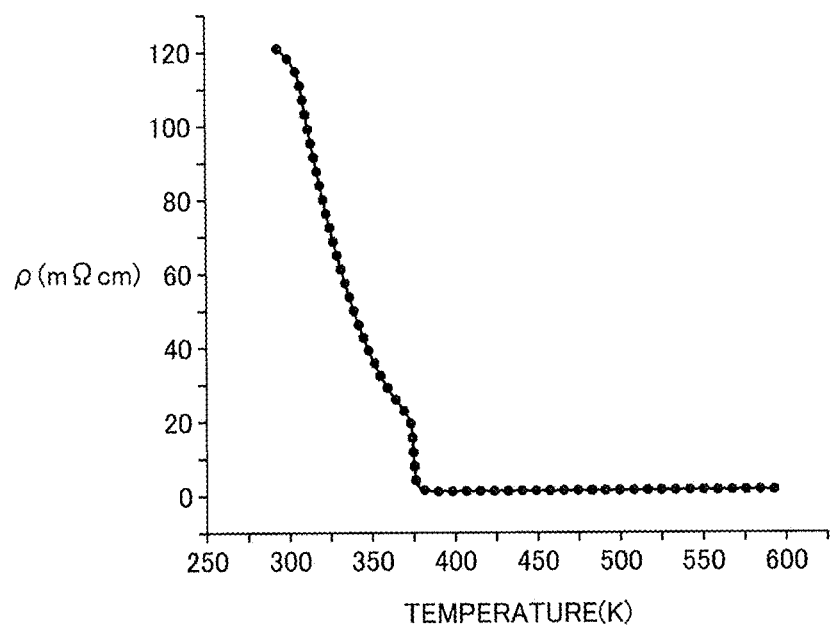
FIG. 3 is a graph showing a relationship between resistivity and temperature of the thermoelectric conversion material.
Figure 4:
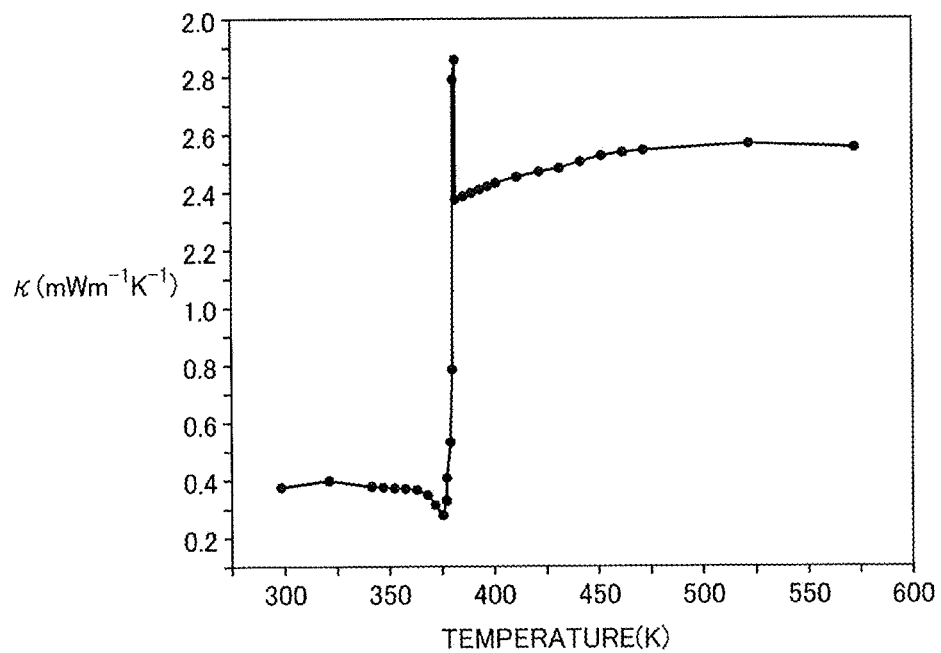
FIG. 4 is a graph showing a relationship between thermal conductivity and temperature of the thermoelectric conversion material.
Figure 5:
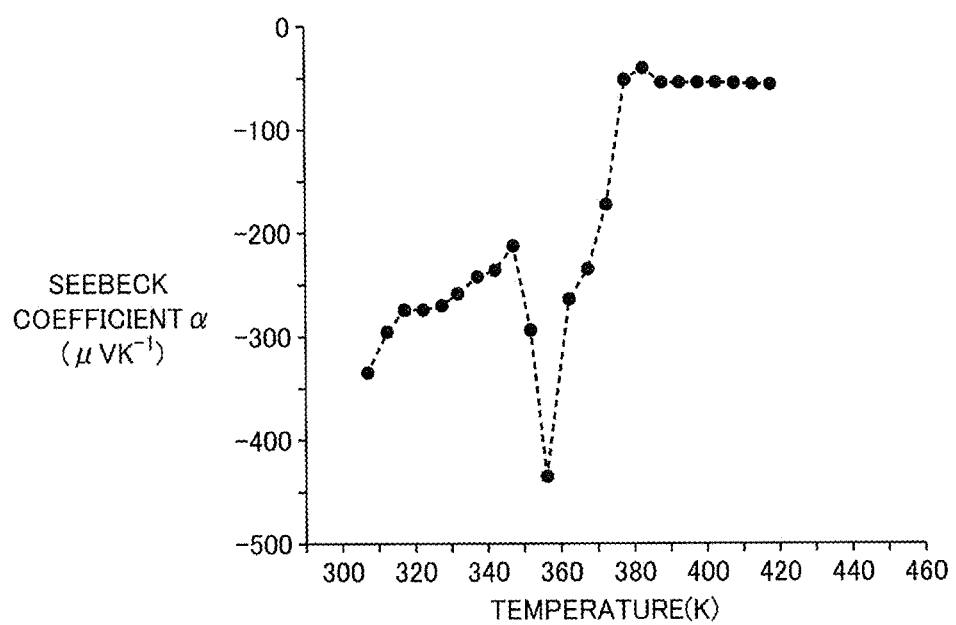
FIG. 5 is a graph showing a relationship between Seebeck coefficient and temperature of the thermoelectric conversion material.
Figure 6:
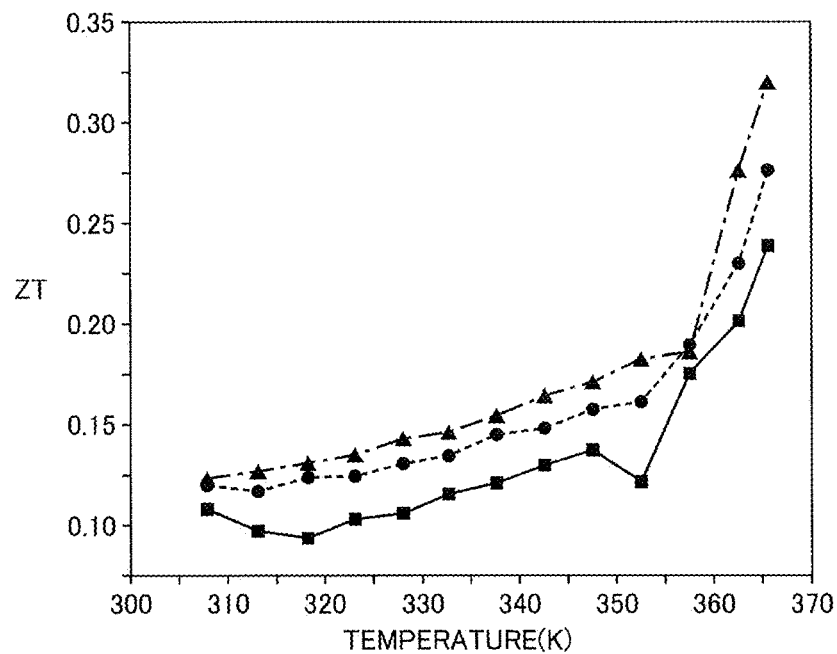
FIG. 6 is a graph showing a relationship between ZT and temperature of the thermoelectric conversion material.
Figure 7:
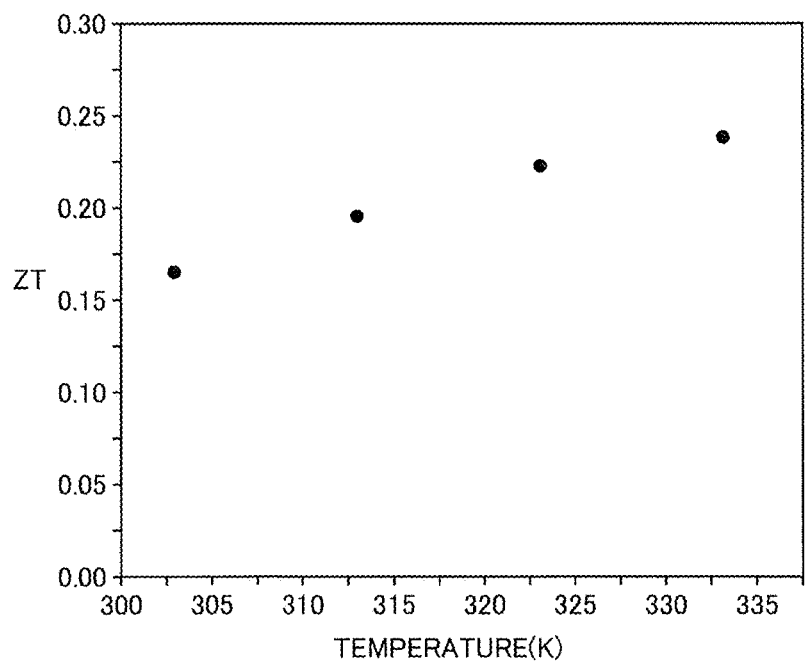
FIG. 7 is a graph showing a relationship between ZT and temperature of the thermoelectric conversion material.

FIG. 3 is a graph showing a relationship between resistivity and temperature of the thermoelectric conversion material when the value of x is set to be 0.3. In FIG. 3, the vertical axis represents resistivity ρ (mΩ·cm) and the horizontal axis represents temperature (K). FIG. 4 is a graph showing a relationship between thermal conductivity and temperature of the thermoelectric conversion material when the value of x is set to be 0.3. In FIG. 4, the vertical axis represents thermal conductivity x $(mWm^{-1}K^{-1})$ and the horizontal axis represents temperature (K). FIG. 5 is a graph showing a relationship between Seebeck coefficient and temperature of the thermoelectric conversion material when the value of x is set to be 0.3. In FIG. 5, the vertical axis represents Seebeck coefficient α $(\mu VK^{-1})$ and the horizontal axis represents temperature (K). FIG. 6 is a graph showing a relationship between ZT and temperature of the thermoelectric conversion material when the value of x is set to be 0.3. FIG. 7 is a graph showing a relationship between ZT and temperature of the thermoelectric conversion material when the value of x is set to be 0.4. In FIGS. 6 and 7, the vertical axis represents ZT and the horizontal axis represents temperature (K). FIG. 6 is an enlarged view of the range from 300 K to 370 K, showing three ZT measurement results obtained in three different measurements. FIG. 7 is an enlarged view of the range from 300 K to 335 K.

Referring firstly to FIG. 3, the resistivity decreases with increasing temperature. This demonstrates that the electrical conductivity, which is the reciprocal of the resistivity, increases with increasing temperature. A relationship of $ZT=\alpha^2 ST/x$ holds, so ZT increases as the electrical conductivity increases. Referring now to FIG. 4, the thermal conductivity is at least greater than 0.2 $(mWm^{-1}K^{-1})$ at each temperature. In particular, the thermal conductivity increases significantly when the temperature exceeds 375 K. Referring to FIG. 5, the Seebeck coefficient α takes a negative value and has a large absolute value. In particular, the absolute value of the Seebeck coefficient α is 100 ($\mu VK^{-1}$) or greater with the temperature of 390 K or lower. It should be noted that an n type thermoelectric conversion material is obtained as the thermoelectric conversion material in the present embodiment.

Referring to FIG. 6, for the thermoelectric conversion material with the value of z being 0.3, the value of ZT in each case increases with increasing temperature in the range shown in FIG. 6. Referring to FIG. 7, for the thermoelectric conversion material with the value of z being 0.4 as well, the value of ZT in each case increases with increasing temperature in the range shown in FIG. 7. Therefore, such thermoelectric conversion materials are able to realize high thermoelectric conversion efficiency.

It should be noted that in the above-described thermoelectric conversion material with the value of z set to be 0.3, the temperature range from 350 K to 380 K is a temperature range in which a cubic crystal structure and at least one of monoclinic and orthorhombic crystal structures are coexistent in the thermoelectric conversion material. That is, in this temperature range, at least one of the monoclinic crystal structure and the orthorhombic crystal structure coexists with the cubic crystal structure in the thermoelectric conversion material. In such a temperature range, the thermal conductivity increases significantly (around 375 K in FIG. 4) and the absolute value of the Seebeck coefficient becomes large (around 355 K in FIG. 5), resulting in a high value of ZT. Therefore, using the thermoelectric conversion material in such a temperature range can achieve a higher thermoelectric conversion efficiency.

Thermoelectric characteristics were measured using a thermoelectric characteristic measuring device (RZ2001i manufactured by Ozawa Science Co., Ltd.) The way of measuring the thermoelectric characteristics is as follows. Firstly, with a thermoelectric conversion material being fixed bridged between a pair of quartz fixtures, the atmosphere is heated using a resistive heating furnace. One of the quartz fixtures is made hollow to let nitrogen gas flow therein for cooling, thereby cooling one end portion of the thermoelectric conversion material. This gives a temperature difference to the thermoelectric conversion material. In the thermoelectric conversion material, a temperature difference between two points on a surface of the thermoelectric conversion material is measured using a platinum-platinum rhodium thermocouple (type R thermocouple). A voltmeter is connected to the thermocouple to measure a voltage generated due to the temperature difference between the two points. This makes it possible to measure the generated voltage with respect to the temperature difference, and on the basis of this to estimate a Seebeck coefficient of the material. A resistance value is measured in accordance with a four-terminal method. Specifically, two electric wires are connected on the outer side relative to two platinum wires to which the voltmeter is connected. Then, a current is passed through the electric wires and the amount of voltage drop is measured using the voltmeter located on the inner side. In this manner, the resistance value of the thermoelectric conversion material is measured in accordance with the four-terminal method. The resistivity is derived from the resistance value measured.

In the thermoelectric conversion material described above, the value of x may be made greater than 0.2. This makes it possible to reliably obtain a thermoelectric conversion material having flexibility and also capable of realizing high thermoelectric conversion efficiency. Further, in the thermoelectric conversion material described above, the value of x may be made smaller than 0.5. With this, a thermoelectric conversion material having flexibility and also capable of realizing high thermoelectric conversion efficiency can be obtained reliably.

Embodiment 2

A description will now be made of a power generation element as an embodiment of a thermoelectric conversion element using the thermoelectric conversion material according to the present disclosure.

Figure 8:
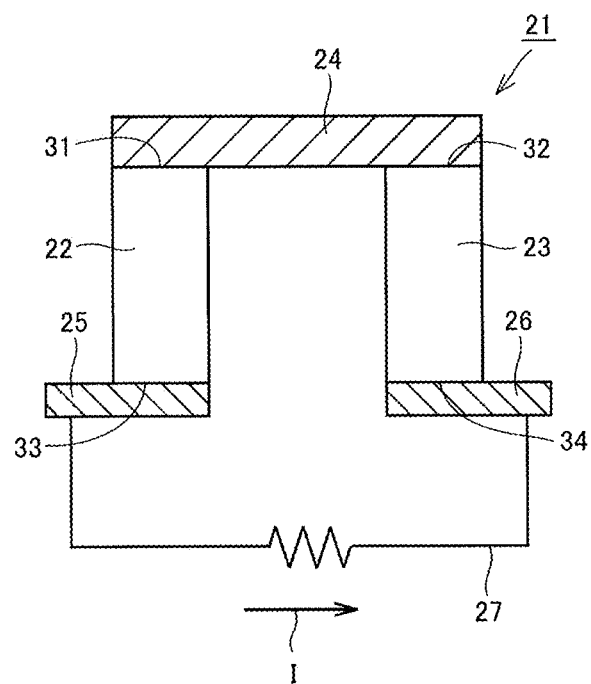
FIG. 8 is a schematic diagram showing the structure of a $\pi$ type thermoelectric conversion element (power generation element), which is a thermoelectric conversion element.

FIG. 8 is a schematic diagram showing the structure of a π type thermoelectric conversion element (power generation element) 21, which is the thermoelectric conversion element in the present embodiment. Referring to FIG. 8, the π type thermoelectric conversion element 21 includes a p type thermoelectric conversion material portion 22 as a first thermoelectric conversion material portion, an n type thermoelectric conversion material portion 23 as a second thermoelectric conversion material portion, a high temperature side electrode 24, a first low temperature side electrode 25, a second low temperature side electrode 26, and a wire 27.

The p type thermoelectric conversion material portion 22 is constituted by a thermoelectric conversion material having p type conductivity. The n type thermoelectric conversion material portion 23 is constituted by the thermoelectric conversion material of Embodiment 1.

The p type thermoelectric conversion material portion 22 and the n type thermoelectric conversion material portion 23 are disposed side by side with a spacing therebetween. The high temperature side electrode 24 is disposed to extend from one end 31 of the p type thermoelectric conversion material portion 22 to one end 32 of the n type thermoelectric conversion material portion 23. The high temperature side electrode 24 is disposed so as to contact both the one end 31 of the p type thermoelectric conversion material portion 22 and the one end 32 of the n type thermoelectric conversion material portion 23. The high temperature side electrode 24 is disposed to connect the one end 31 of the p type thermoelectric conversion material portion 22 and the one end 32 of the n type thermoelectric conversion material portion 23. The high temperature side electrode 24 is composed of an electrically conductive material, such as a metal. The high temperature side electrode 24 is in ohmic contact with the p type thermoelectric conversion material portion 22 and the n type thermoelectric conversion material portion 23.

The first low temperature side electrode 25 is disposed in contact with another end 33 of the p type thermoelectric conversion material portion 22. The first low temperature side electrode 25 is disposed apart from the high temperature side electrode 24. The first low temperature side electrode 25 is composed of an electrically conductive material, such as a metal. The first low temperature side electrode 25 is in ohmic contact with the p type thermoelectric conversion material portion 22.

The second low temperature side electrode 26 is disposed in contact with another end 34 of the n type thermoelectric conversion material portion 23. The second low temperature side electrode 26 is disposed apart from the high temperature side electrode 24 and the first low temperature side electrode 25. The second low temperature side electrode 26 is composed of an electrically conductive material, such as a metal.

The second low temperature side electrode 26 is in ohmic contact with the n type thermoelectric conversion material portion 23.

The wire 27 is composed of an electric conductor such as a metal. The wire 27 electrically connects the first low temperature side electrode 25 and the second low temperature side electrode 26.

In the π type thermoelectric conversion element 21, when a temperature difference is formed so that the one end 31 side of the p type thermoelectric conversion material portion 22 and the one end 32 side of the n type thermoelectric conversion material portion 23 are at a high temperature and the other end 33 side of the p type thermoelectric conversion material portion 22 and the other end 34 side of the n type thermoelectric conversion material portion 23 are at a low temperature, for example, then p type carriers (holes) move from the one end 31 side toward the other end 33 side in the p type thermoelectric conversion material portion 22. At this time, in the n type thermoelectric conversion material portion 23, n type carriers (electrons) move from the one end 32 side toward the other end 34 side. As a result, a current flows through the wire 27 in the direction of the arrow I. In this manner, power generation by thermoelectric conversion using a temperature difference is achieved in the π type thermoelectric conversion element 21. In other words, the π type thermoelectric conversion element 21 is a power generation element.

As the material constituting the n type thermoelectric conversion material portion 23, the thermoelectric conversion material of Embodiment 1 exhibiting a large value of ZT, for example, is adopted. As a result, the π type thermoelectric conversion element 21 is a highly efficient power generation element.

Here, the thermoelectric conversion element 21 described above is preferably used in a temperature range in which at least one of the monoclinic and orthorhombic crystal structures is coexistent with the cubic crystal structure in the thermoelectric conversion material. Specifically, as explained above, the thermoelectric conversion material having the value of z of 0.3 is preferably used in a temperature range from 350 K to 380 K. This enables the use in the state where the value of ZT is large, whereby a higher thermoelectric conversion efficiency can be achieved.

In the above embodiment, the π type thermoelectric conversion element has been described as an example of the thermoelectric conversion element of the present disclosure. However, the thermoelectric conversion element of the present disclosure is not limited thereto. The thermoelectric conversion element of the present disclosure may be a thermoelectric conversion element having another structure, such as an I type (unileg) thermoelectric conversion element, for example.

Embodiment 3

A plurality of π type thermoelectric conversion elements 21 can be electrically connected to obtain a power generation module as a thermoelectric conversion module. A power generation module 41, the thermoelectric conversion module of the present embodiment, has a structure of a plurality of π type thermoelectric conversion elements 21 connected in series.

Figure 9:
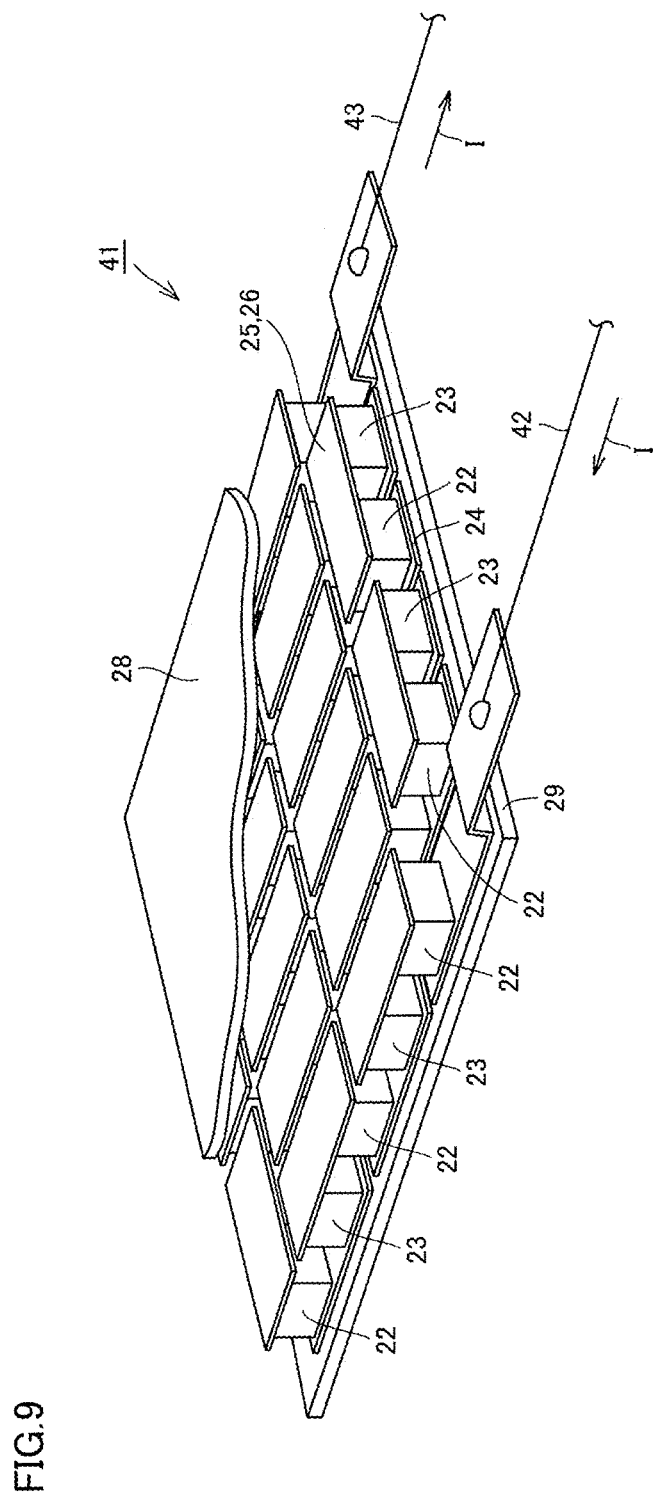
FIG. 9 shows an exemplary structure of a power generation module.

FIG. 9 shows an exemplary structure of a power generation module. Referring to FIG. 9, the power generation module 41 of the present embodiment includes p type thermoelectric conversion material portions 22, n type thermoelectric conversion material portions 23, low temperature side electrodes 25, 26 each corresponding to the first and second low temperature side electrodes 25 and 26, high temperature side electrodes 24, a low temperature side insulator substrate 28, and a high temperature side insulator substrate 29. The low temperature side insulator substrate 28 and the high temperature side insulator substrate 29 are composed of a ceramic such as alumina. The p type thermoelectric conversion material portions 22 and the n type thermoelectric conversion material portions 23 are arranged alternately side by side. A low temperature side electrode 25, 26 is disposed in contact with a p type thermoelectric conversion material portion 22 and an n type thermoelectric conversion material portion 23, as in the above-described π type thermoelectric conversion element 21. A high temperature side electrode 24 is disposed in contact with a p type thermoelectric conversion material portion 22 and an n type thermoelectric conversion material portion 23, as in the above-described π type thermoelectric conversion element 21. A p type thermoelectric conversion material portion 22 is connected to an adjacent n type thermoelectric conversion material portion 23 on one side via a common high temperature side electrode 24. This p type thermoelectric conversion material portion 22 is also connected to an adjacent n type thermoelectric conversion material portion 23 on a side different from the above one side via a common low temperature side electrode 25, 26. In this manner, all the p type thermoelectric conversion material portions 22 and n type thermoelectric conversion material portions 23 are connected in series.

The low temperature side insulator substrate 28 is disposed on a main surface side of the plate-shaped low temperature side electrodes 25, 26 opposite to the side on which they contact the p type thermoelectric conversion material portions 22 and the n type thermoelectric conversion material portions 23. One low temperature side insulator substrate 28 is disposed for the plurality of (all the) low temperature side electrodes 25, 26. The high temperature side insulator substrate 29 is disposed on a side of the plate-shaped high temperature side electrodes 24 opposite to the side on which they contact the p type thermoelectric conversion material portions 22 and the n type thermoelectric conversion material portions 23. One high temperature side insulator substrate 29 is disposed for the plurality of (all the) high temperature side electrodes 24.

Wires 27 are connected to the high temperature side electrodes 24 or the low temperature side electrodes 25, 26 in contact with the p type thermoelectric conversion material portion 22 or the n type thermoelectric conversion material portion 23 located at respective ends of the series-connected p type thermoelectric conversion material portions 22 and n type thermoelectric conversion material portions 23. When a temperature difference is formed so that the high temperature side insulator substrate 29 side attains a high temperature and the low temperature side insulator substrate 28 side attains a low temperature, then the series-connected p type thermoelectric conversion material portions 22 and n type thermoelectric conversion material portions 23 permit a current to flow in the directions of the arrows I, as in the case of the π type thermoelectric conversion element 21 described above. In this manner, power generation by thermoelectric conversion using a temperature difference is achieved in the power generation module 41.

Embodiment 4

A description will now be made of an infrared sensor, which is one of optical sensors, as another embodiment of the thermoelectric conversion element using the thermoelectric conversion material according to the present disclosure.

Figure 10:
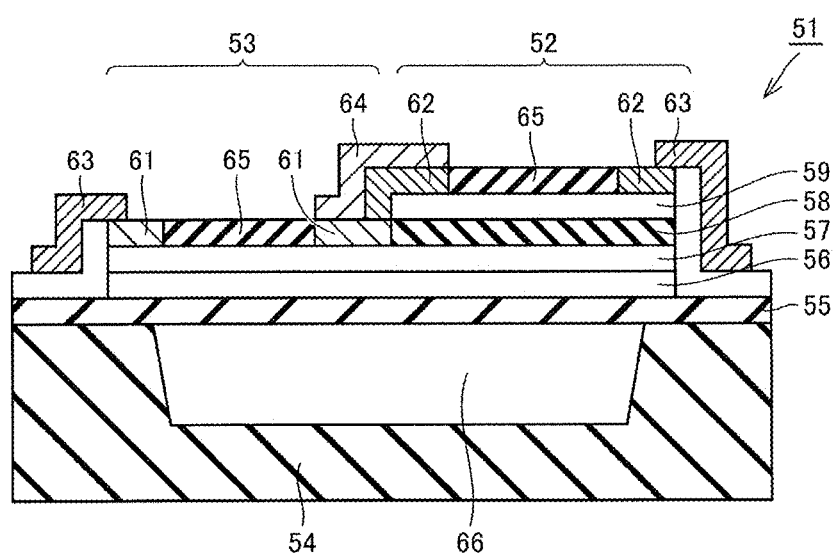
FIG. 10 shows an exemplary structure of an infrared sensor.

FIG. 10 shows an exemplary structure of an infrared sensor 51. Referring to FIG. 10, the infrared sensor 51 includes a p type thermoelectric conversion material portion 52 and an n type thermoelectric conversion material portion 53 disposed adjacent to each other. The p type thermoelectric conversion material portion 52 and the n type thermoelectric conversion material portion 53 are formed on a substrate 54.

The infrared sensor 51 includes the substrate 54, an etching stop layer 55, an n type thermoelectric conversion material layer 56, an n$^+$ type ohmic contact layer 57, an insulator layer 58, a p type thermoelectric conversion material layer 59, n side ohmic contact electrodes 61, p side ohmic contact electrodes 62, a heat absorption pad 63, an absorber 64, and a protective film 65.

The substrate 54 is composed of an insulator such as silicon dioxide. The substrate 54 has a recess 66 formed therein. The etching stop layer 55 is formed to cover a surface of the substrate 54. The etching stop layer 55 is composed of an insulator such as silicon nitride, for example. A gap is formed between the etching stop layer 55 and the recess 66 of the substrate 54.

The n type thermoelectric conversion material layer 56 is formed on a main surface of the etching stop layer 55 opposite to the substrate 54. A thermoelectric conversion material constituting the n type thermoelectric conversion material layer 56 is the thermoelectric conversion material of Embodiment 1. The n$^+$ type ohmic contact layer 57 is formed on a main surface of the n type thermoelectric conversion material layer 56 opposite to the etching stop layer 55. The n$^+$ type ohmic contact layer 57 is doped with n type impurities that cause the generation of n type carriers (electrons) as majority carriers, for example, whereby the n$^+$ type ohmic contact layer 57 has n type conductivity.

The n side ohmic contact electrode 61 is disposed to contact a central portion of a main surface of the n$^+$ type ohmic contact layer 57 opposite to the n type thermoelectric conversion material layer 56. The n side ohmic contact electrode 61 is composed of a material that can make ohmic contact with the n$^+$ type ohmic contact layer 57, such as a metal. The insulator layer 58, composed of an insulator such as silicon dioxide, for example, is disposed on the main surface of the n$^+$ type ohmic contact layer 57 opposite to the n type thermoelectric conversion material layer 56. The insulator layer 58 is disposed on the main surface of the n$^+$ type ohmic contact layer 57 on the p type thermoelectric conversion material portion 52 side with respect to the n side ohmic contact electrode 61.

The protective film 65 is also disposed on the main surface of the n$^+$ type ohmic contact layer 57 opposite to the n type thermoelectric conversion material layer 56. The protective film 65 is disposed on the main surface of the n$^+$ type ohmic contact layer 57 on the opposite side from the p type thermoelectric conversion material portion 52 side with respect to the n side ohmic contact electrode 61. On the main surface of the n$^+$ type ohmic contact layer 57 opposite to the n type thermoelectric conversion material layer 56, another n side ohmic contact electrode 61 is disposed on the opposite side from the above-described n side ohmic contact electrode 61, with the protective film 65 sandwiched therebetween.

The p type thermoelectric conversion material layer 59 is disposed on a main surface of the insulator layer 58 opposite to the n$^+$ type ohmic contact layer 57.

The protective film 65 is disposed at a central portion on a main surface of the p type thermoelectric conversion material layer 59 opposite to the insulator layer 58. On the main surface of the p type thermoelectric conversion material layer 59 opposite to the insulator layer 58, a pair of p side ohmic contact electrodes 62 are disposed sandwiching the protective film 65 therebetween. The p side ohmic contact electrodes 62 are composed of a material that can make ohmic contact with the p type thermoelectric conversion material layer 59, such as a metal. Of the pair of p side ohmic contact electrodes 62, the p side ohmic contact electrode 62 on the n type thermoelectric conversion material portion 53 side is connected to the n side ohmic contact electrode 61.

The absorber 64 is disposed to cover main surfaces of the mutually connected p side ohmic contact electrode 62 and n side ohmic contact electrode 61 opposite to the n$^+$ type ohmic contact layer 57. The absorber 64 is composed of titanium, for example. The heat absorption pad 63 is disposed to be in contact with the top surface of the p side ohmic contact electrode 62 that is not connected to the n side ohmic contact electrode 61. The heat absorption pad 63 is also disposed to be in contact with the top surface of the n side ohmic contact electrode 61 that is not connected to the p side ohmic contact electrode 62. As a material constituting the heat absorption pad 63, gold (Au)/titanium (Ti), for example, is adopted. That is, the absorber 64 and the n type thermoelectric conversion material layer 56 are thermally connected to each other. The absorber 64 and the p type thermoelectric conversion material layer 59 are thermally connected to each other.

When the infrared sensor 51 is irradiated with infrared rays, the absorber 64 absorbs the energy of the infrared rays. As a result, the temperature of the absorber 64 rises. On the other hand, the temperature rise of the heat absorption pad 63 is suppressed. This forms a temperature difference between the absorber 64 and the heat absorption pad 63. Accordingly, in the p type thermoelectric conversion material layer 59, p type carriers (holes) move from the absorber 64 side toward the heat absorption pad 63 side. On the other hand, in the n type thermoelectric conversion material layer 56, n type carriers (electrons) move from the absorber 64 side toward the heat absorption pad 63 side. Then, by extracting a current generated as a result of the migration of the carriers from the n side ohmic contact electrodes 61 and the p side ohmic contact electrodes 62, the infrared rays are detected.

In the infrared sensor 51 of the present embodiment, the thermoelectric conversion material of Embodiment 1 is adopted as the thermoelectric conversion material constituting the n type thermoelectric conversion material layer 56. As a result, the infrared sensor 51 is an infrared sensor of high sensitivity. Further, the thermoelectric conversion material, with its flexibility, can address the case where flexibility is required for the n type thermoelectric conversion material layer 56.

Embodiment 5

Figure 11:
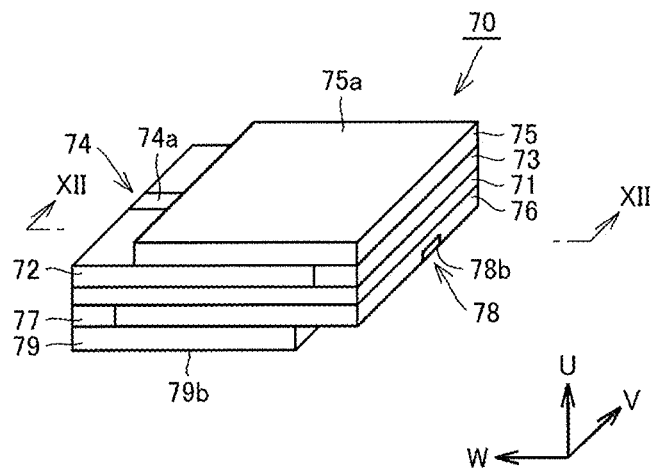
FIG. 11 is a schematic perspective view of a thermoelectric conversion element in Embodiment 5.
Figure 12:
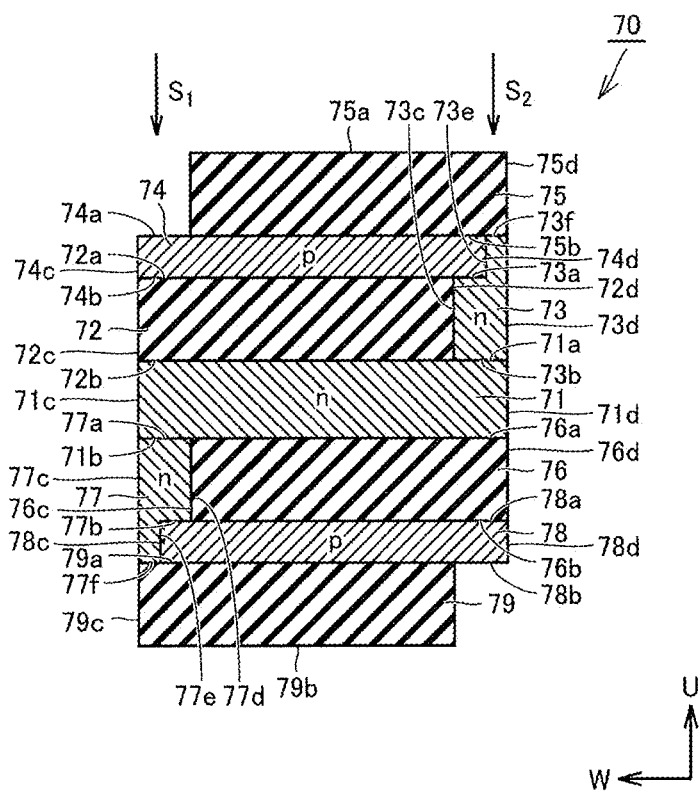
FIG. 12 is a schematic cross-sectional view of the thermoelectric conversion element shown in FIG. 11, taken along the line segment XII-XII.

A yet another embodiment, Embodiment 5, will now be described. FIG. 11 is a schematic perspective view of a thermoelectric conversion element in Embodiment 5. FIG. 12 is a schematic cross-sectional view of the thermoelectric conversion element shown in FIG. 11, taken along the line segment XII-XII. Embodiment 5 differs from Embodiment 2 in shapes and arrangement states of thermoelectric conversion material portions.

Referring to FIGS. 11 and 12, the thermoelectric conversion element 70 in Embodiment 5 includes a first material portion 71, a second material portion 72, a third material portion 73, and a fourth material portion 74. The thermoelectric conversion element 70 further includes a fifth material portion 75, a sixth material portion 76, a seventh material portion 77, an eighth material portion 78, and a ninth material portion 79. In FIGS. 11 and 12, the thickness direction of the thermoelectric conversion element 70 in Embodiment 5 is the direction indicated by the arrow U or the opposite direction thereof. The direction in which the strip-shaped third material portion 73, described later, extends is the direction indicated by the arrow V or the opposite direction thereof. The direction in which the strip-shaped fourth material portion 74, described later, extends is the direction indicated by the arrow W or the opposite direction thereof. The direction indicated by the arrow U corresponds to one of the U directions, and the direction opposite to the direction indicated by the arrow U corresponds to the other of the U directions. The direction indicated by the arrow V corresponds to one of the V directions, and the direction opposite to the direction indicated by the arrow V corresponds to the other of the V directions. The direction indicated by the arrow W corresponds to one of the W directions, and the direction opposite to the direction indicated by the arrow W corresponds to the other of the W directions. The U directions, the V directions, and the W directions are orthogonal to each other.

The first material portion 71 is a thermoelectric conversion material portion. The first material portion 71 is of a plate shape. The first material portion 71 has a rectangular shape as viewed in the thickness direction. The thickness direction of the first material portion 71 is the direction indicated by the arrow U or the opposite direction thereof. The first material portion 71 has n type conductivity. The first material portion 71 is constituted by the thermoelectric conversion material described above. That is, the first material portion 71 is constituted by the thermoelectric conversion material represented by the composition formula $Ag_2S_{(1-x)}Se_x$, where x has a value of greater than 0.01 and smaller than 0.6. Specifically, the material of the first material portion 71 is $Ag_2S_{0.5}Se_{0.5}$. The first material portion 71 is obtained, for example, by rolling the thermoelectric conversion material of the shape in Embodiment 1 in the Z direction and cutting it into a predetermined shape.

The second material portion 72 is of a plate shape. The second material portion 72 has a rectangular shape as viewed in the thickness direction (U direction) of the first material portion 71. The second material portion 72 has flexibility. The second material portion 72 is insulating. Examples of the material of the second material portion 72 include $Ag_2S$. The second material portion 72 is disposed on the first material portion 71. Specifically, the second material portion 72 is arranged such that one face 71a in the thickness direction of the first material portion 71 and another face 72b in the thickness direction of the second material portion 72 oppose and contact each other. As viewed in the thickness direction of the first material portion 71, the second material portion 72 has an area smaller than that of the first material portion 71. Specifically, in the V direction, the second material portion 72 and the first material portion 71 have the same length, and in the W direction, the second material portion 72 is shorter in length than the first material portion 71. In the W direction, the second material portion 72 is arranged such that one end 72c in the W direction of the second material portion 72 is aligned with one end 71c in the W direction of the first material portion 71.

The third material portion 73 has electrical conductivity. The third material portion 73 is of a strip shape. The third material portion 73 is constituted by the thermoelectric conversion material described above. That is, the material of the third material portion 73 is the same as the material of the first material portion 71. The third material portion 73 is disposed on the first material portion 71 in a position different from the second material portion 72. Specifically, the third material portion 73 is arranged such that the one face 71a in the thickness direction of the first material portion 71 and another face 73b in the thickness direction of the third material portion 73 oppose and contact each other. Further, the third material portion 73 is disposed so as to contact the second material portion 72 in the W direction. Specifically, the third material portion 73 is arranged such that another end 72d in the W direction of the second material portion 72 and one end 73c in the W direction of the third material portion 73 contact each other. In the W direction, the third material portion 73 is arranged such that another end 73d in the W direction of the third material portion 73 is aligned with another end 71d in the W direction of the first material portion 71. In this case, the third material portion 73 is arranged such that its longitudinal direction coincides with the V direction. The third material portion 73 has a step, and its end 73e constituting the stepped surface is located on the end 73d side in the W direction relative to the end 73c.

The fourth material portion 74 has flexibility. The fourth material portion 74 is of a strip shape. The fourth material portion 74 is composed of at least one of a metallic material and a thermoelectric conversion material having p type conductivity. In the present embodiment, the fourth material portion 74 is composed of a metallic material, specifically chromel. Chromel is an alloy containing 89 mass % nickel (Ni), 9.8 mass % chromium (Cr), 1 mass % iron (Fe), and 0.2 mass % manganese (Mn). In other words, the fourth material portion 74 is composed of chromel in the form of a strip. The fourth material portion 74 is disposed on the second material portion 72 and in contact with the third material portion 73. Specifically, the fourth material portion 74 is arranged such that one face 72a in the thickness direction of the second material portion 72 and one face 73a in the thickness direction of a portion of the third material portion 73 oppose and contact another face 74b of the fourth material portion 74. The fourth material portion 74 is arranged such that another end 74d in the W direction of the fourth material portion 74 contacts the one end 73e in the W direction of a portion of the third material portion 73. In the W direction, the fourth material portion 74 is arranged such that one end 74c in the W direction of the fourth material portion 74 is aligned with the one end 72c in the W direction of the second material portion 72. The fourth material portion 74 is disposed so as to be embedded in the second material portion 72. The fourth material portion 74 is disposed in a central region of the second material portion 72 in the V direction.

The fifth material portion 75 is of a plate shape. The fifth material portion 75 has a rectangular shape as viewed in the thickness direction of the first material portion 71. The fifth material portion 75 has flexibility. The fifth material portion 75 is insulating. Examples of the material of the fifth material portion 75 include the same material as that of the second material portion 72, specifically $Ag_2S$. The fifth material portion 75 is disposed on a portion of the third material portion 73 and a portion of the fourth material portion 74. Specifically, the fifth material portion 75 is arranged such that one face 73f in the thickness direction of the third material portion 73 and a portion of one face 74a in the thickness direction of the fourth material portion 74 oppose and contact another face 75b in the thickness direction of the fifth material portion 75. The fifth material portion 75 is also disposed on the second material portion 72 except for the region where the fourth material portion 74 is disposed. As viewed in the thickness direction of the first material portion 71, the fifth material portion 75 is smaller in area than the first material portion 71. Specifically, in the V direction, the fifth material portion 75 and the first material portion 71 have the same length, and in the W direction, the fifth material portion 75 is shorter in length than the first material portion 71. In the W direction, the fifth material portion 75 is arranged such that another end 75d in the W direction of the fifth material portion 75 is aligned with the other end 73d in the W direction of the third material portion 73. The fifth material portion 75 is disposed so as to expose a portion of the one face 74a of the fourth material portion 74. The fifth material portion 75 has one face 75a in the thickness direction exposed.

The sixth material portion 76 is identical to the second material portion 72 in terms of size, shape, material, and the like. The sixth material portion 76 is disposed on the first material portion 71. Specifically, it is arranged such that another face 71b in the thickness direction of the first material portion 71 opposes and contacts one face 76a in the thickness direction of the sixth material portion 76. In the W direction, the second material portion 72 is arranged such that another end 76d in the W direction of the sixth material portion 76 is aligned with the other end 71d in the W direction of the first material portion 71.

The seventh material portion 77, the eighth material portion 78, and the ninth material portion 79 are identical to the third material portion 73, the fourth material portion 74, and the fifth material portion 75, respectively, in terms of size, shape, material, and the like. The seventh material portion 77 is arranged such that the other face 71b in the thickness direction of the first material portion 71 opposes and contacts one face 77a in the thickness direction of the seventh material portion 77. The seventh material portion 77 is disposed so as to contact the sixth material portion 76 in the W direction. Specifically, the seventh material portion 77 is arranged such that one end 76c in the W direction of the sixth material portion 76 contacts another end 77d in the W direction of the seventh material portion 77. In the W direction, the seventh material portion 77 is arranged such that one end 77c in the W direction of the seventh material portion 77 is aligned with the one end 71c in the W direction of the first material portion 71. In this case, the seventh material portion 77 is arranged such that its longitudinal direction coincides with the V direction. The seventh material portion 77 has a step, and its end 77e constituting the stepped surface is located on the end 77c side in the W direction relative to the end 77d.

The eighth material portion 78 is disposed on the sixth material portion 76 and in contact with the seventh material portion 77. Specifically, the eighth material portion 78 is arranged such that another face 76b in the thickness direction of the sixth material portion 76 and another face 77b in the thickness direction of a portion of the seventh material portion 77 oppose and contact one face 78a of the eighth material portion 78. The eighth material portion 78 is arranged such that one end 78c in the W direction of the eighth material portion 78 contacts the other end 77e in the W direction of a portion of the seventh material portion 77. In the W direction, the eighth material portion 78 is arranged such that another end 78d in the W direction of the eighth material portion 78 is aligned with the other end 76d in the W direction of the sixth material portion 76. The eighth material portion 78 is disposed so as to be embedded in the sixth material portion 76. The eighth material portion 78 is disposed in a central region of the sixth material portion 76 in the V direction.

The ninth material portion 79 is disposed on a portion of the seventh material portion 77 and a portion of the eighth material portion 78. Specifically, the ninth material portion 79 is arranged such that another face 77f in the thickness direction of the seventh material portion 77 and a portion of another face 78b in the thickness direction of the eighth material portion 78 oppose and contact one face 79a in the thickness direction of the ninth material portion 79. The ninth material portion 79 is also disposed on the sixth material portion 76 except for the region where the eighth material portion 78 is disposed. In the W direction, the ninth material portion 79 is arranged such that one end 79c in the W direction of the ninth material portion 79 is aligned with the one end 77c in the W direction of the seventh material portion 77. The ninth material portion 79 is disposed so as to expose a portion of the other face 78b of the eighth material portion 78. The ninth material portion 79 has its another face 79b in the thickness direction exposed. It should be noted that the material portions are arranged such that, in the V direction, the one ends of the first material portion 71, the second material portion 72, the third material portion 73, the fifth material portion 75, the sixth material portion 76, the seventh material portion 77, and the ninth material portion 79 are aligned with each other. Further, the material portions are arranged such that, in the V direction, the other ends of the first material portion 71, the second material portion 72, the third material portion 73, the fifth material portion 75, the sixth material portion 76, the seventh material portion 77, and the ninth material portion 79 are aligned with each other.

Such a thermoelectric conversion element 70 can be produced, for example, through the following process. Firstly, as the first material portion 71, the thermoelectric conversion material in Embodiment 1 is rolled in the Z direction to form a plate. The plate is then cut into a predetermined size. The second material portion 72, the third material portion 73, the fifth material portion 75, the sixth material portion 76, the seventh material portion 77, and the ninth material portion 79 are formed in a similar manner. The strip-shaped fourth material portion 74 and eighth material portion 78 are also prepared. Next, the respective materials are stacked so as to be arranged in the above-described manner. Thereafter, they are heated while applying a load in the thickness direction. That is, hot pressing is performed. The conditions for the hot pressing in the case of producing, for example, the thermoelectric conversion element 70 of a rectangular shape which has, as viewed in the thickness direction, a length in the V direction, or, the vertical direction of 10 mm and a length in the W direction, or, the horizontal direction of 12 mm may be set as follows. For example, the pressure is set to be 400 MPa, the temperature is set to be 373 K (100° C.), the holding time is set to be 60 minutes, and the atmosphere is set to be air as the conditions for the hot pressing. In this manner, the thermoelectric conversion element 70 of the above configuration is produced.

In the thermoelectric conversion element 70 described above, the first material portion 71 and the fourth material portion 74 are electrically connected via the third material portion 73. The first material portion 71 and the eighth material portion 78 are electrically connected via the seventh material portion 77. In the thermoelectric conversion element 70 described above, the first material portion 71 of n type conductivity has its ends in the W direction electrically connected respectively to the fourth material portion 74 and the eighth material portion 78 of p type conductivity, with the insulating second material portion 72 and sixth material portion 76 respectively sandwiched therebetween in the thickness direction. One electrode is electrically connected to an exposed region of the one face 74a of the fourth material portion 74. Another electrode is electrically connected to an exposed region of the other face 78b of the eighth material portion 78. When a temperature difference is generated in the W direction, specifically such that the region indicated by the arrow $S_1$ attains a high temperature and the region indicated by the arrow $S_2$ attains a low temperature, for example, then the temperature difference can be converted into electric energy to thereby generate electric power.

Figure 13:
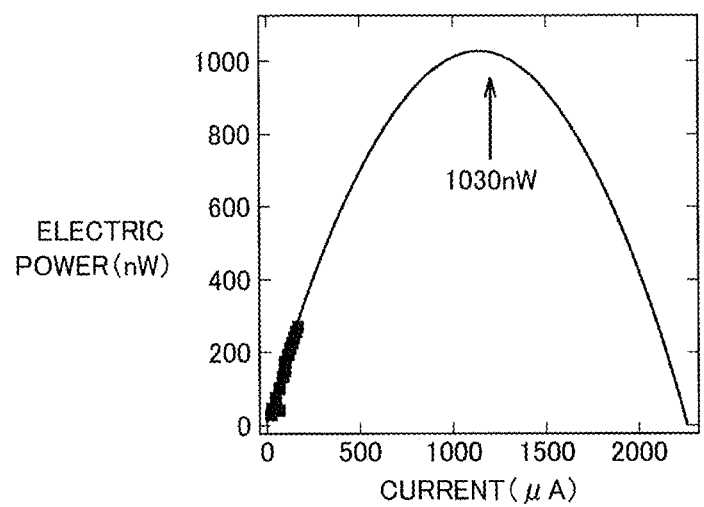
FIG. 13 is a graph showing electric power that is generated when the amount of electric current is varied by applying a temperature difference of 30 K to the thermoelectric conversion element in Embodiment 5.

The characteristics of the thermoelectric conversion element 70 of such a configuration were investigated. FIG. 13 is a graph showing the electric power that is generated when a temperature difference of 30 K is applied to the thermoelectric conversion element in Embodiment 5 to vary the amount of electric current. In FIG. 13, the vertical axis represents electric power (nW) and the horizontal axis represents current (μA). Referring to FIG. 13, with the temperature difference of 30 K, a current of about 1100 μA flows and a maximum power of 1030 nW is generated. As such, the thermoelectric conversion element 70 of the present embodiment is able to obtain a high power output.

As explained above, the thermoelectric conversion element 70 has flexibility in the thickness direction, which is the direction in which the materials are stacked. Therefore, the thermoelectric conversion element is flexible in the thickness direction, which can reduce the risk of cracking or chipping. Further, the assembly process required for ordinary thermoelectric modules is unnecessary, making the producing process relatively simple. Furthermore, the density of the thermocouples can be easily increased as compared to the ordinary thermoelectric modules, facilitating the downsizing of the module.

In the present embodiment, the second material portion 72 is composed of $Ag_2S$. $Ag_2S$ has flexibility. $Ag_2S$ also has ductility, facilitating the process of forming it into a plate shape. Such a material is therefore suitably used for the thermoelectric conversion element 70 described above.

In the thermoelectric conversion element 70 described above, the first material portion 71, the third material portion 73, and the seventh material portion 77 are composed of the same material. Therefore, the element 70 may be obtained by arranging, on a single plate-shaped member, smaller plate-shaped members constituting the second material portion 72 and sixth material portion 76 with their positions shifted from each other in the W direction, and subjecting them together to hot pressing. In other words, the first material portion 71, the third material portion 73, and the seventh material portion 77 can be configured and produced as one piece.

In the present embodiment, the fifth material portion 75, the sixth material portion 76, the seventh material portion 77, the eighth material portion 78, and the ninth material portion 79 may be omitted. Further, the third material portion 73 and the seventh material portion 77 may be composed of a different material from the first material portion 71.

Although the third material portion 73 and the seventh material portion 77 each have a step in the present embodiment, the configuration is not limited thereto. At least one of the third material portion 73 and the seventh material portion 77 may be configured not to have a step. In this case, at least one of the third material portion 73 and the seventh material portion 77 may be exposed in the W direction, for example. Further, although the fourth material portion 74 and the eighth material portion 78 each have a strip shape in the present embodiment, their shapes are not limited thereto. At least one of the fourth material portion 74 and the eighth material portion 78 may have, for example, a plate shape.

It should be understood that the embodiments disclosed herein are illustrative and non-restrictive in every respect. The scope of the present disclosure is defined by the terms of the claims, rather than the description above, and is intended to include any modifications within the scope and meaning equivalent to the terms of the claims.

DESCRIPTION OF REFERENCE NUMERALS 11, 70 thermoelectric conversion material
12 region
13a, 14a, 14b, 14c, 14d, 14e, 14f, 14g, 14h data item
21 π type thermoelectric conversion element
22, 52 p type thermoelectric conversion material portion
23, 53 n type thermoelectric conversion material portion
24 high temperature side electrode
25 first low temperature side electrode (low temperature side electrode)
26 second low temperature side electrode (low temperature side electrode)
27, 42, 43 wire
28 low temperature side insulator substrate
29 high temperature side insulator substrate
31, 32, 33, 34, 71c, 71d, 72c, 72d, 73c, 73d, 73e, 74c, 74d, 75d, 76c, 76d, 77c, 77d, 77e, 78c, 78d, 79c end
41 thermoelectric conversion module
51 infrared sensor
54 substrate
55 etching stop layer
56 n type thermoelectric conversion material layer
57 $n^+$ type ohmic contact layer
58 insulator layer
59 p type thermoelectric conversion material layer
61 n side ohmic contact electrode
62 p side ohmic contact electrode
63 heat absorption pad
64 absorber
65 protective film
66 recess
71 first material portion
71a, 71b, 72a, 72b, 73a, 73b, 73f, 74a, 74b, 75a, 75b, 76a, 76b, 77a, 77b, 77f, 78a, 78b, 79a, 79b face
72 second material portion
73 third material portion
74 fourth material portion
75 fifth material portion
76 sixth material portion
77 seventh material portion
78 eighth material portion
79 ninth material portion
$S_1$, $S_2$, I arrow

The invention claimed is:
1. A thermoelectric conversion material represented by a composition formula $Ag_2S_{(1-x)}Se_x$,
x having a value of greater than 0.01 and smaller than 0.6.
2. The thermoelectric conversion material according to claim 1, wherein the value of x is greater than 0.2.

3. The thermoelectric conversion material according to claim 1, wherein the value of x is smaller than 0.5.

4. A thermoelectric conversion element comprising:
a thermoelectric conversion material portion;
a first electrode disposed in contact with the thermoelectric conversion material portion; and
a second electrode disposed in contact with the thermoelectric conversion material portion and apart from the first electrode;
the thermoelectric conversion material portion being constituted by the thermoelectric conversion material according to claim 1.

5. The thermoelectric conversion element according to claim 4, wherein the thermoelectric conversion element is used in a temperature range in which a cubic crystal structure and at least one of monoclinic and orthorhombic crystal structures are coexistent in the thermoelectric conversion material.

6. A thermoelectric conversion module comprising the thermoelectric conversion element according to claim 4.

7. An optical sensor comprising:
an absorber that absorbs optical energy; and
a thermoelectric conversion material portion connected to the absorber,
the thermoelectric conversion material portion being constituted by the thermoelectric conversion material according to claim 1.

8. A thermoelectric conversion element comprising:
a first material portion of a plate shape constituted by the thermoelectric conversion material according to claim 1, the first material portion having n type conductivity;
an insulating second material portion of a plate shape disposed on the first material portion, the second material portion having flexibility;
a third material portion disposed on the first material portion in a position different from the second material portion, the third material portion having electrical conductivity; and
a fourth material portion disposed on the second material portion and in contact with the third material portion, the fourth material portion being composed of at least one of a metallic material and a thermoelectric conversion material having p type conductivity, the fourth material portion having flexibility.

9. The thermoelectric conversion element according to claim 8, wherein the second material portion is constituted by $Ag_2S$.

* * * * *